(12) United States Patent
Finger et al.

(10) Patent No.: US 9,589,794 B2
(45) Date of Patent: Mar. 7, 2017

(54) HOT-WIRE METHOD FOR DEPOSITING SEMICONDUCTOR MATERIAL ON A SUBSTRATE AND DEVICE FOR PERFORMING THE METHOD

(75) Inventors: Friedhelm Finger, Juelich (DE); Andreas Schmalen, Huertgenwald (DE); Johannes Wolff, Langerwehe (DE)

(73) Assignee: Forschungszentrum Juelich GmbH, Juelich (DE)

( * ) Notice: Subject to any disclaimer, the term of this patent is extended or adjusted under 35 U.S.C. 154(b) by 678 days.

(21) Appl. No.: 14/004,734

(22) PCT Filed: Mar. 30, 2012

(86) PCT No.: PCT/DE2012/000346
§ 371 (c)(1),
(2), (4) Date: May 1, 2014

(87) PCT Pub. No.: WO2012/142992
PCT Pub. Date: Oct. 26, 2012

(65) Prior Publication Data
US 2014/0235036 A1    Aug. 21, 2014

(30) Foreign Application Priority Data
Apr. 20, 2011    (DE) .................. 10 2011 018 324

(51) Int. Cl.
C23C 16/00    (2006.01)
H01L 21/02    (2006.01)
(Continued)

(52) U.S. Cl.
CPC .......... *H01L 21/0262* (2013.01); *C23C 16/24* (2013.01); *C23C 16/325* (2013.01); *C23C 16/4488* (2013.01); *C30B 25/02* (2013.01); *H01L 21/02529* (2013.01); *H01L 21/02532* (2013.01)

(58) Field of Classification Search
CPC ........ C23C 16/271; C23C 16/52; C30B 25/02
See application file for complete search history.

(56) References Cited

U.S. PATENT DOCUMENTS 5,146,481 A * 9/1992 Garg .................. C23C 16/271
                                                378/35
5,479,025 A * 12/1995 Huniu .................. F41G 7/004
                                                219/553

(Continued)

FOREIGN PATENT DOCUMENTS

JP    2004-091821    3/2004
WO    WO-2011/034751    3/2011

OTHER PUBLICATIONS

S. Ogawa et al.: Applications of microcrystalline hydrogenaed cubic silicon carbide for amorphous silicon thin film solar cells. In: Thin Solid Films, 516, 2008, pp. 740-742.

(Continued)

*Primary Examiner* — Matthew Song
(74) *Attorney, Agent, or Firm* — Jordan and Koda, PLLC

(57) ABSTRACT

A hot wire device and method for depositing semiconductor material onto a substrate in a deposition chamber in which the ends of at least two filaments are clamped into a filament holder and heated by supplying current, wherein a voltage for generating an electrical current is applied in temporal succession to filaments made of differing materials so that a number of differing semiconductors corresponding to the number of consecutively heated filament materials can be consecutively deposited onto the substrate without opening the chamber.

15 Claims, 3 Drawing Sheets

(51) Int. Cl.
*C30B 25/02* (2006.01)
*C23C 16/24* (2006.01)
*C23C 16/32* (2006.01)
*C23C 16/448* (2006.01)

(56) References Cited

U.S. PATENT DOCUMENTS

| | | | |
|---|---|---|---|
| 2003/0164225 A1* | 9/2003 | Sawayama | C23C 16/24 156/345.29 |
| 2009/0197014 A1* | 8/2009 | Wu | C23C 16/27 427/569 |
| 2011/0033638 A1 | 2/2011 | Ponnekanti et al. | |
| 2011/0104848 A1* | 5/2011 | Haas | C23C 16/24 438/57 |
| 2012/0003497 A1* | 1/2012 | Handy | B05D 1/60 428/615 |

OTHER PUBLICATIONS

Tao Chen et al: "Microcrystalline silicon thin film solar cells with microcrystalline silicon carbide window layers and silicon absorber layers both prepared by Hot-Wire CVD", Physica Status Solidi (RRL)—Rapid Research Letters, vol. 4, No. 3-4, Apr. 1, 2010 (Apr. 10, 2010), pp. 61-63, XP55033138 ISSN: 1862-6254, DOI: 10.1002/pssr.200903423 p. 62, paragraph 2.

Yae et al.: "Solar to chemical conversion using metal nanoparticle modified microcrystalline silicon thin film photoelectrode", Solar Energy Materials and Solar Cells, Elsevier Science Publishers, Amsterdam, NL, vol. 91, No. 4, Dec. 10, 2006 (Dec. 10, 2006), pp. 224-229, XP005882122, ISSN: 0927-0248, DOI: 10.1016/J.Solmat. 2006.08.010, p. 225, paragraph 2.

Ogawa et al.: "Amorphous Si1-xCx:H films prepared by hot-wire CVD using SiH3CH3 and SiH4 mixture gas and its application to window layer for silicon thin film solar cells", Thin Solid Films, Elsevier-Sequoia S.A. Lausanne, CH, vol. 516, No. 5, Jan. 15, 2008 (Jan. 15, 2008), pp. 758-760, XP022492173, ISSN: 0040-6090, ODI: 10.1016/J.JCIS.2007.12.013, pp. 516, paragraph 2.

Ogawa et al.: "Applications of microcrystalline hydrogenated cubic silicon carbide for amorphous silicon thin film solar cells", Thin Solid Films, Elsevier-Sequoia S.A. Lausanne, CH, vol. 516, No. 5, Jan. 15, 2008 (Jan. 15, 2008), pp. 740-742, XP022492168, ISSN: 0040-6090, DOI: 10.1016/J.TSF.2007.06.047, p. 741, paragraph 2.

* cited by examiner

HOT-WIRE METHOD FOR DEPOSITING SEMICONDUCTOR MATERIAL ON A SUBSTRATE AND DEVICE FOR PERFORMING THE METHOD

BACKGROUND OF THE INVENTION

The invention relates to a hot wire method for depositing semiconductor material onto a substrate, and to a device for carrying out the method.

In the hot wire chemical vapor deposition (HWCVD) method, a gas mixture is decomposed into fragments in the vicinity of the substrate using a heated filament. A decomposition product is deposited onto the substrate. The chemical composition of the layers can be adjusted very well by way of the selection and the mixing ratio of the types of gas that are employed.

When producing semiconductor layers, such as microcrystalline silicon (μc-Si:H) and microcrystalline silicon carbide (μc-SiC:H), using the hot wire method, the selection of the filament material is of decisive importance for the quality of the layers and for the stability of the filaments during the process, and over an extended operating time. It was found that tantalum (Ta) is the material best suited for producing μc-Si:H. Rhenium (Re) is found to be best material for producing μc-SiC:H. While rhenium may also be used to produce μc-Si:H, alternating deposition of μc-Si:H and μc-SiC:H results in destruction of the rhenium filaments.

The drawback is that it is not possible to deposit multiple semiconductor layers in a hot wire (HWCVD) chamber with a fast method.

SUMMARY OF THE INVENTION

It is the object of the invention to provide a hot wire (HWCVD) method by way of which semiconductor layers can be quickly deposited, and to provide a device for carrying out the method.

The hot wire method is carried out so as to deposit semiconductor materials onto a substrate in a deposition chamber. For this purpose, the ends of at least two filaments are clamped into a filament holder in the chamber. A voltage is applied so as to heat the filaments and thus thermally or catalytically decompose precursor compounds and deposit the desired semiconductors onto the substrate. Filaments made of differing materials are advantageously connected to a voltage source and energized in temporal succession, so that a number of differing semiconductors corresponding to the number of consecutively heated filament materials are consecutively deposited onto the substrate without opening the chamber.

It was recognized as part of the invention that the deposition of differing layers is possible in the prior art only after the filament material in the deposition chamber has been changed by way of a complex process. Changing the filament material requires the deposition chamber to be opened and the expensive filaments to be replaced, and thus entails additional time for introducing the new filament. As an alternative, individual chambers fitted with differing filaments are required for each deposition process, however the drawback here is that the coated substrate has to be removed from one chamber and transferred into another chamber for further coating. This measure thus also results in lost time.

According to the invention, the ends of at least two filaments made of differing materials are fixed and clamped into filament holders. The filaments are energized in temporal succession by supplying current and connection to one or more voltage sources. This advantageously causes only the filament material that is required for depositing a semiconductor to be heated, and the other filament to be electrically activated after the material has been deposited, so that at least two semiconductor materials are deposited in temporal succession without opening the chamber. The voltage is applied to decompose what are known as precursor compounds, which pass over the filaments in gaseous form. The compounds dissociate into fragments.

The fragments optionally react with additional fragments or precursor compounds before they are deposited onto the substrate.

Thus, fast and cost-effective consecutive deposition of differing semiconductor materials onto the substrate is advantageously achieved.

In one embodiment of the invention, a filament holder is selected which comprises at least two power supply elements that are electrically insulated from each other, for at least two different filament materials. Each power supply element advantageously causes heating of a filament, or of multiple filaments, made of one material, and thus the decomposition of a precursor compound and the deposition of the desired semiconductor aligned with the heated filaments.

It is particularly advantageous for multiple filaments that are made of the same material to be simultaneously heated by each power supply element. The supply of current for heating filaments of one filament type is distributed.

This advantageously allows a greater amount of semiconductor material to be deposited onto a larger substrate surface aligned with the simultaneously heated filaments of a particular type.

It is particularly advantageous for the materials of the at least two different filaments that are clamped into the device to be rhenium and tantalum. This advantageously causes reproducible and lasting μc-Si:H and μc-SiC:H semiconductor layers to be produced in many deposition processes, without the drawback of the filament materials becoming damaged, and without opening the chamber.

It is particularly advantageous that, during the process, μc-Si:H and μc-SiC:H can be alternately deposited using the tantalum filament and rhenium filament without having to open the hot wire chamber to replace the filaments. The starting substances used for producing μc-Si:H are the gases silane ($SiH_4$) and hydrogen ($H_2$) and the gases for producing μc-SiC:H are monomethyl silane ($H_3Si$—$CH_3$) and $H_2$. The gases phosphine ($PH_3$), diborane ($B_2H_6$), trimethyl boron ($B(CH_3)_3$) and trimethyl aluminum ($Al_2(CH_3)_6$) are employed for doping.

The device for carrying out the hot wire (HWCVD) method is characterized by a filament holder for receiving at least two different filaments which simultaneously connects the filaments made of a first material to a different circuit than the filaments made of a second or third material and so forth.

The filament, or the filaments, of one material type are connected to a particular circuit by way of the filament holder.

Thus, "at least two filaments" shall mean that the holder can hold at least two filaments made of differing materials. It is also possible to dispose two, three or more filaments made of the same material next to, or between, two, three or more filaments made of another material, for example in an alternating fashion. It is also possible to hold even more filaments made of differing materials in the filament holder in alternating fashion, wherein the filaments made of one material are always simultaneously connected to a particular circuit or to a power source. This advantageously causes only the filaments made of one particular material to be simultaneously heated, while the filaments made of the remaining materials are not heated at that time. When the semiconductor has been deposited, the filament made of a second material is, or the filaments made of a second material are, heated, and the semiconductor intended for this deposition is deposited. This advantageously causes only one particular semiconductor to be deposited at a time onto the substrate by heating of the corresponding filament material for the dissociation of the precursor compound for this semiconductor.

The device advantageously comprises a filament holder having two holding blocks for receiving the ends of filaments oriented parallel to each other. The holding blocks are advantageously made of ceramic material or another electrically insulating, current-resistant and vacuum-proof material. This is advantageously achieved by being able to clamp the filaments into the mutually parallel end faces of the ceramic holders, without the power supply elements and terminals influencing each other electrically, because the ceramic material by nature acts as an insulator. The material can preferably be made of Macor™. MACOR comprises approximately: 46% $SiO_2$, 17% MgO, 16% $Al_2O_3$, 10% $K_2O$, 7% $B_2O_3$ and 4% F.

The holding blocks comprise at least two current-conducting rails as power supply elements. The conductor rails are mounted on a holding block, for example, and form part of differing circuits, or alternatively a power source, which may a single power source, may make electrical contact with the rails consecutively. Each conductor rail is in electrical contact with the filaments made of one particular material type and distributes the current from the power source to these filaments. Each rail is thus intended for heating the filaments made of one particular material, and thus for heating the filament, or the filaments, so as to deposit a particular semiconductor. Each conductor rail is in electrical contact with a power source and the filaments, or distributes the current from this power source to the filaments made of the same material.

A current-conducting rail thus makes contact with the filaments made of identical material, so that advantageously a particular semiconductor from the precursor gas that is introduced into the chamber dissociates and can be deposited over a larger area, in keeping with the fixation of the filaments over the substrate. It is also possible that contact is made by a conductor rail with only a single filament made of a particular material.

The filament holder particularly advantageously also comprises gas supply lines aligned with the filaments. For this purpose, in addition to the conductor rails and the clamps for the filaments, the holding blocks comprise clamps for the gas supply lines disposed parallel to the clamps for the filaments. The gas supply lines are, for example, arranged in tubular form, having outlet holes beneath the filaments in the holding blocks. This advantageously causes the gas to be conducted to the filaments in a targeted manner, resulting in savings in terms of consumption.

It is thus possible for the holding blocks to advantageously comprise, for example, a total of six clamps for alternately clamping, in each case, three filaments made of the same material. For example, the ends of the first filament of the first type are first clamped into the two holding blocks and thus are fixed between the holding blocks. Thereafter, a filament of the second type follows. The first type may be a filament made of rhenium, and the second type may be a filament made of tantalum. Then, another filament of the first type follows, and a still further filament of the second type follows. This alternating positioning of filaments of the at least two types particularly advantageously results in uniform heating of the gas volume of a hot wire chamber over the substrate.

Of course, it is possible to alternately dispose more than two types of filaments between the holding blocks of the device. The number of power supply elements that are required for the holding blocks must then at least correspond to the number of the filament types that are used.

Conductor rails serving as power supply elements may be disposed on the holding blocks for this purpose. These are connected to the power supply of the hot wire chamber so that the filaments made of one material (filament type 1) are consecutively activated separately from the filaments made of a second material (filament type 2). This advantageously causes only filaments of one type to be energized and heated, while the other filament type, or types, is not, or are not, in operation.

A hot wire chamber according to the invention for carrying out the method according to any one of the preceding claims is characterized by filament holders for receiving the ends of the two filaments, wherein the filament holder can establish at least two separate circuits for connection to the at least two circuits of the hot wire chamber.

The invention will be described in greater detail hereafter based on one exemplary embodiment, without thereby limiting the invention.

DESCRIPTION OF THE PREFERRED EMBODIMENTS

Figure 1:
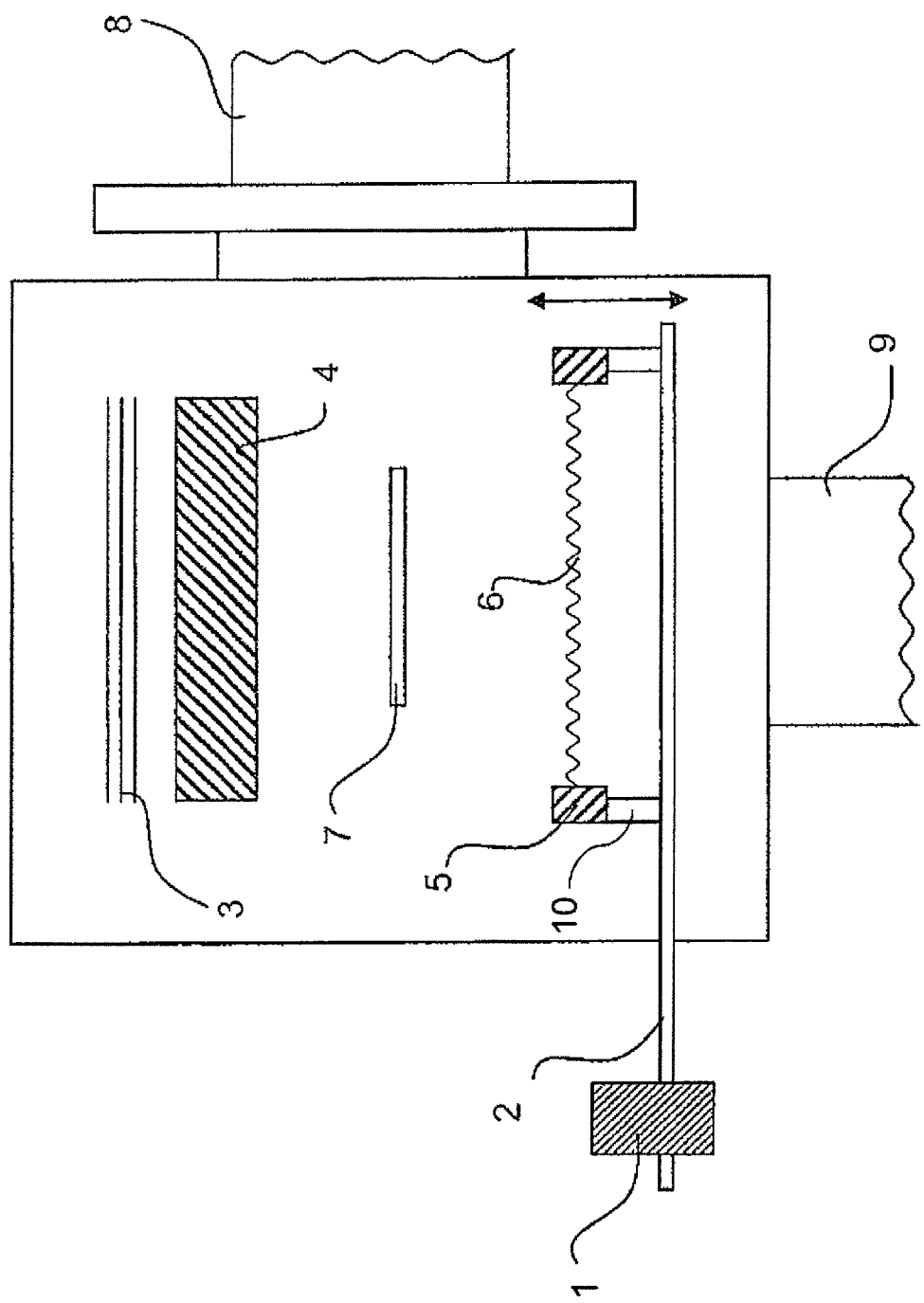
FIG. 1 shows a cross-sectional view of the hot wire (HWCVD) deposition chamber according to the invention.

FIG. 1 shows the deposition chamber according to the invention. Gas is conducted via the main gas valve 1 into the chamber by way of the gas supply line 2. The gas flows along the filaments 6 into the chamber beneath the filament holder 5 comprising two holding blocks. The substrate 7 is disposed parallel to the filaments 6 in the chamber. The heater 4 for the substrate 7 heats the same. Heat shields 3 shield the chamber from the heater 4. The pump system 9 and the robot chamber 8 complete the chamber.

Figure 2:
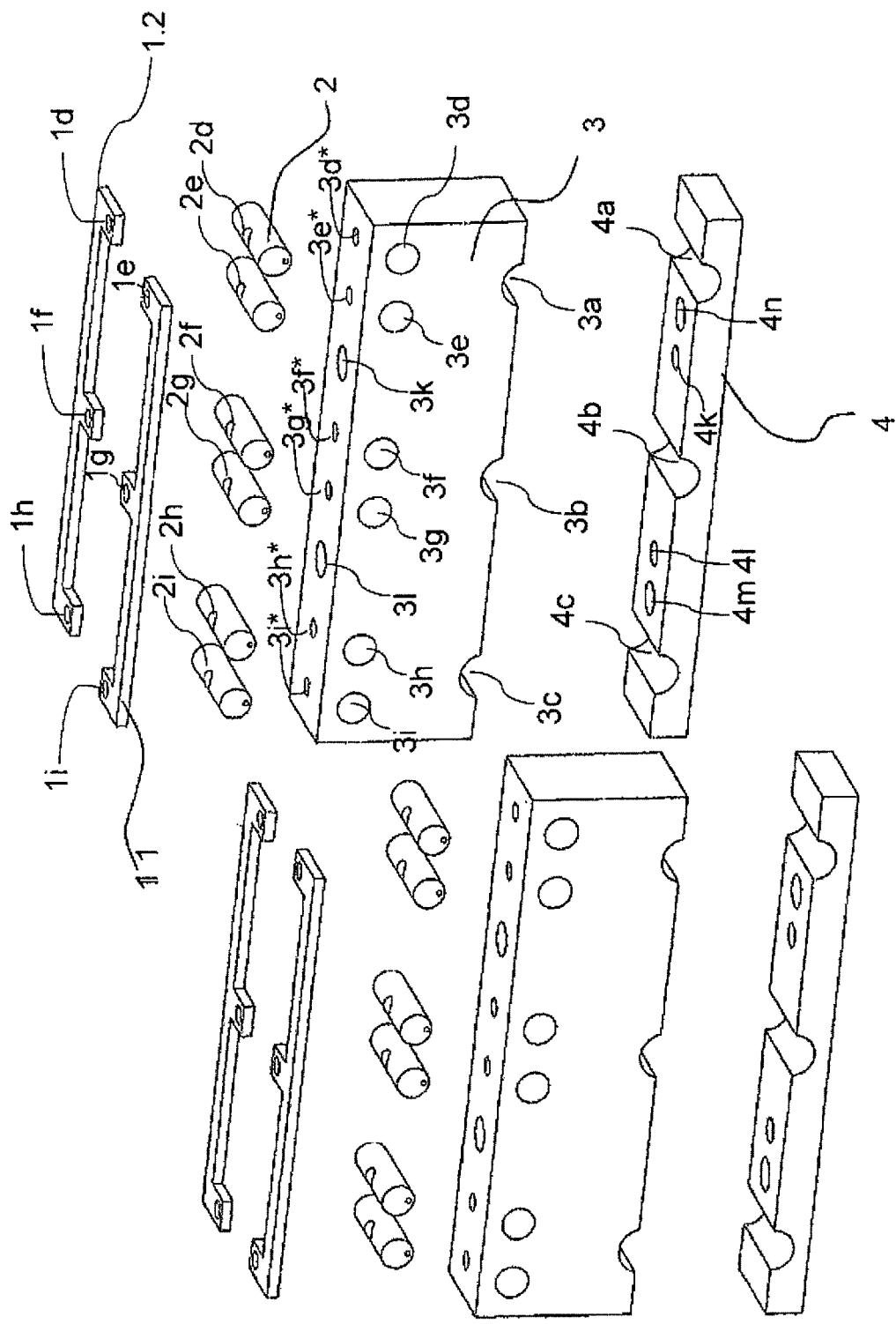
FIG. 2 shows an exploded view of the design according to the invention of a device for carrying out the hot wire (HWCVD) method.

FIG. 2 shows an exploded view of the device according to the invention for carrying out the method according to the invention. The filament holder according to the invention comprises two holding blocks 3, 4, in addition to conductor rails 1.1 and 1.2 and filament holding sleeves 2.

Each of the two holding blocks 3, 4 is composed of an upper ceramic base body 3 and a lower ceramic flat body 4. The upper and lower bodies are screwed together by way of screws and the holes 4k on 3k and 4l on 3l. When assembled, the holding body 3 and the flat body 4 are pressed against each other, so that the semicircular openings 3a on 4a, 3b on 4b and 3c on 4c in each case join to form a circular clamping mount for a respective gas supply line (see FIG. 3).

The filaments are held as follows: The conductor rails 1.1 and 1.2 are placed onto the filament holder 3 in a mutually engaging way, without coming in contact with each other, so that the holes 1e, 1g and 1i of conductor rail 1.1 are seated on the holes 3e*, 3g* and 3i* of the base body 3. The filament holding sleeves 2 (only the sleeve on the far right is denoted by reference numeral 2) are thus introduced into the holes 3d to 3i of the filament holder so that the holes 2d, 2e, 2f. 2g, 2h and 2i of the filament holding sleeves 2, as well as the holes 1e, 1g and 1i of the conductor rail 1.1 and the holes 1d, 1f and 1h of the conductor rail 1.2, as well as the holes 3d* to 3i* are positioned on top of each other so as to screw the parts to the filaments.

Screws are introduced for this purpose into the holes 1d to 1i of the conductor rails 1.1 and 1.2 and clamp the conductor rails against the holder 3. The screws also fasten the sleeves 2 to the holder 3. A filament that was introduced into the interior cavity of the sleeve 2 is thus clamped against the sleeve. The small holes at the end faces of the sleeves 2 show the passages for the total of six filaments that are fixed between the holding blocks, refer to FIG. 3.

These processes are described by way of example for the right part of the device according to the invention. Of course, when joined, three filaments made of two material types are alternately introduced into the right and left filament holders, respectively, and clamped, as described above.

Figure 3:
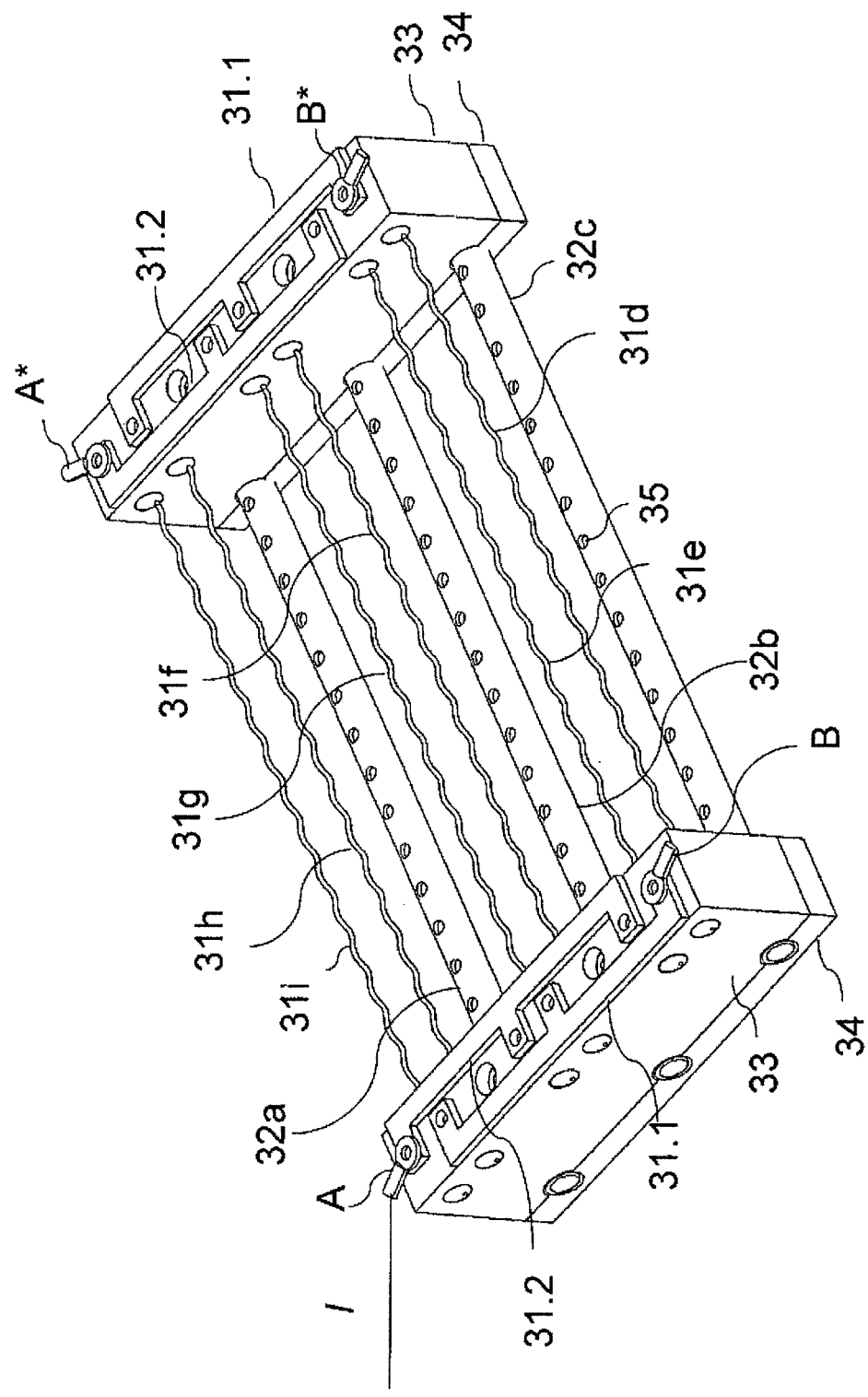
FIG. 3 shows FIG. 2 as a design according to the invention, including the filament holder and the gas supply lines as well as the connections to the circuits by way of the two conductor rails for each holding block.

The procedure is shown in FIG. 3. Reference numerals 31.1, 31.2, 33 and 34 correspond to reference numerals 1.1, 1.2, 3 and 4 of FIG. 2, and reference is made to FIG. 2 for further description.

The filaments 31d, 31f and 31h are made of rhenium. They are clamped into the sleeves 2d, 2f and 2h, as is shown in FIG. 2, by way of the holes 3d, 3f and 3h.

The filaments 31e, 31g and 31i are made of tantalum. They are clamped into the sleeves 2e, 2g and 2i, as is shown in FIG. 2, by way of the holes 3e, 3g and 3i.

The filaments are fixed between the right and left holders 33, 34 and as described for FIG. 2. The filaments are pushed into the sleeves corresponding to the filaments for this purpose, and are screwed to the holding blocks 33, 34. Conductor rails 31.1 and 31.2 are disposed on the holding blocks for this purpose. The filament is clamped via the holes in the conductor rails, as is described for FIG. 2, and fixed between the blocks 33, 34.

During operation, either gas types 1 or 2 are consecutively introduced via holes 35 into the chamber by way of the gas supply lines 32a, 32b and 32c. Each gas supply line 32a-c supplies two filaments with precursors or is directed to two filaments, refer to FIG. 3.

Clamp A is connected to a direct current source (not shown). When clamp A on the conductor rail 31.2 is energized via the power supply element, the filaments 31i, 31g and 31e, which are conductively connected to the conductor rail 31.2, are energized. The first circuit is closed via clamp A*.

The gas mixture that is conducted through the hollow pipe 32a-c is fragmented by the heated rhenium filaments.

The power supply on clamp A is interrupted and the gas supply is stopped.

Clamp B is then energized. When clamp B on conductor rail 31.1 is energized via the power supply element, the filaments 31d, 31f and 31h, which are conductively connected to the conductor rail 31.1, are energized. The second circuit is closed via clamp B*.

The gas mixture that is conducted through the hollow pipe 32a-c is fragmented by the tantalum filaments.

During operation of the rhenium filaments, the tantalum filaments thus are dormant, or are not heated, and vice versa.

The assembled filament holder is screwed onto flanges 10 of the chamber, as is shown in FIG. 1, using the holes 4m and 4n, as shown in FIG. 2.

One exemplary embodiment for producing μc-Si:H and μc-SiC:H layers using the novel HWCVD filament holder will be described hereafter.

The depositions for testing the filament holder for the alternating production of μc-Si:H and μc-SiC:H using the HWCVD method, without changing the filament materials between depositions, take place in a HWCVD deposition system comprising a load-lock chamber. The glass substrates, each measuring 10×10 cm$^2$, are inwardly transferred through the load lock. For further processing of the μc-SiC:H layers to obtain solar cells, glass substrates that are partially coated with etched ZnO are utilized. Si wafers are also used as substrates for analyzing individual layers by way of infrared spectroscopy.

Three rhenium filaments (for μc-SiC:H) and three tantalum filaments (for μc-Si:H) deposition, which are connected in parallel, are located in each filament holder. The differing filament materials can be activated separately, which is to say supplied with voltage.

The following process conditions are established for μc-Si:H deposition:

Substrate temperature: 180° C.; temperature of the tantalum filaments: 1900 to 2000° C.; process gases: silane diluted to 2 to 10% in hydrogen; total gas flow rate: 100 sccm; process pressure: 0.06 hPa.

The following process conditions are established for μc-SiC:H deposition:

Substrate temperature: 220° C.; temperature of the rhenium filaments: 1700 to 1800° C.; process gases: monomethyl silane diluted to 0.3% in hydrogen; total gas flow rate: 100 sccm; process pressure: 0.75 hPa.

The deposition sequences and times are shown in the table:

| | Material | | | | |
|---|---|---|---|---|---|
| | 1) Re | 2) Ta | 3) Re | 4) Ta | 5) Re |
| Deposition times, total (hours | 19 | 6 | 24 | 12 | 3 |

The indicated multiple filament material switchovers did not result in any discernible damage to the filament materials. The accumulated layer thicknesses are approximately 5 μm for μc-Si:H and approximately 3 μm for μc-SiC:H.

The quality of the μc-Si:H layers was analyzed by way of electrical photoconductivity and dark conductivity measurements, and measurements of the hydrogen content and the hydrogen bond structure by way of infrared spectroscopy and optical absorption. The layers exhibit features that are typical of good electro-optical quality, in keeping with those that are produced with filament holders using only one filament material.

The quality of the μc-SiC:H layers was analyzed by installing these layers in solar cells with μc-Si:H absorber layers. The μc-SiC:H window layers produced with the double filament holder result in solar cells of as high a quality as solar cells produced using a filament holder having only one filament material.

The invention claimed is:

1. A hot wire method for depositing semiconductor material onto a substrate in a deposition chamber, comprising clamping the ends of at least two filaments into a filament holder, heating the filaments by supplying current, applying a voltage for generating an electrical current in temporal succession to filaments made of differing materials so that a number of differing semiconductors corresponding to the number of consecutively heated filaments materials can be consecutively deposited onto the substrate without opening the chamber.

2. The method according to claim 1, comprising selecting a filament holder that comprises mutually electrically insulated power supply elements for the differing filament materials.

3. The method according to claim 1, comprising selecting multiple filaments made of the same material and simultaneously heating the multiple filaments by distributing supplied power.

4. The method according to claim 1, comprising selecting rhenium and tantalum as materials for the at least two different filaments.

5. The method according to claim 4, comprising alternatingly depositing μc-Si:H using the tantalum filament, and μc-SiC:H using the rhenium filament.

6. The method according to claim 1, wherein said clamping comprises clamping the ends of the at least two filaments that are of differing wire type between mounting blocks of the filament holder.

7. A hot wire deposition device for carrying out a hot wire method according to claim 1, comprising:
a first holder assembly comprising a first body that is electrically-insulating and current-resistant;
a second holder assembly comprising a second body that is electrically-insulating and current-resistant;
a plurality of first filaments longitudinally extending from said first body to said second body;
a plurality of second filaments longitudinally extending from said first body to said second body and being of a different wire type than said plurality of first filaments;
a first conductor rail extending along a first face of the first body;
a second conductor rail, electrically isolated from the first conductor rail, extending along the first face of the first body;
a first electrical circuit comprising the first conductor rail and the plurality of first filaments, the first electrical circuit adapted to receive a first signal at the first conductor rail that energizes the plurality of first filaments; and
a second electrical circuit comprising the second conductor rail and the plurality of second filaments, the second electrical circuit adapted to receive a second signal at the second conductor rail that energizes the plurality of second filaments; and
wherein the first electrical circuit and the second electrical circuit are configured to be separately controllable in temporal succession; and
wherein the first holder assembly and the second holder assembly comprise said filament holder.

8. The device according to claim 7, wherein the wherein the first holder assembly and second holder assembly are configured to hold the plurality of first filaments and the plurality of second filaments in parallel.

9. The device according to claim 8, wherein the first body and second body are made of ceramic material.

10. The device according to claim 8, wherein the first electrical circuit further comprises a third conductor rail extending along a first face of the second body; and
wherein the second electrical circuit further comprises a fourth conductor rail, electrically isolated from the third conductor rail, extending along the first face of the second body.

11. The device according to claim 8 wherein the first body is a first upper body and the first holder assembly further comprises a first lower body pressed to the first upper body into contact and firming an interface therebetween, the first lower body being electrically-insulating and current-resistant;
wherein the second body is a second upper body and the second holder assembly further comprises a second lower body pressed to the second upper body into contact and forming an interface therebetween, the second lower body being electrically-insulating and current-resistant; and
further comprising:
a plurality of gas supply lines longitudinally extending from said first holder assembly to said second holder assembly and being clamped at said interface of said first holder assembly and said interface of said second holder assembly.

12. The device according to claim 11, wherein each one gas supply line of the plurality of gas supply lines is situated below two filaments from among said plurality of first filaments and said plurality of second filaments in longitudinal alignment with said situated two filaments, and comprises a plurality of holes situated along a length of said one gas supply line oriented to direct supplied gas outward from a longitudinal axis of said one gas supply line toward said situated two filaments.

13. The device according to claim 8, wherein the first body and the second body are made of $Al_2O_3$.

14. The device according to claim 8, wherein the first holder assembly further comprises a plurality of first sleeves respectively received into a corresponding plurality of first openings in the first body, each one first sleeve of the plurality of first sleeves adapted to hold a corresponding filament of the plurality of first filaments; and
wherein the first holder assembly further comprises a plurality of second sleeves respectively received into a corresponding plurality of second openings in the first body, each one second sleeve of the plurality of second sleeves adapted to hold a corresponding filament of the plurality of second filaments.

15. The device according to claim 14, wherein the first holder assembly further comprises a plurality of first screws, each one of the plurality of first screws being situated to fasten the first conductor rail to the first body and to secure a corresponding first sleeve of the plurality of first sleeves into a corresponding first opening of the plurality of first openings;
wherein the second holder assembly further comprises a plurality of first screws, each one of the plurality of first screws being situated to fasten the first conductor rail to the first body and to secure a corresponding second sleeve of the plurality of second sleeves into a corresponding second opening of the plurality of second openings;

wherein the first electrical circuit further comprises the plurality of first screws; and wherein the second electrical circuit further comprises the plurality of second screws.

* * * * *